(12) United States Patent
Minamio et al.

(10) Patent No.: US 7,816,777 B2
(45) Date of Patent: Oct. 19, 2010

(54) SEMICONDUCTOR-ELEMENT MOUNTING SUBSTRATE, SEMICONDUCTOR DEVICE, AND ELECTRONIC EQUIPMENT

(75) Inventors: Masanori Minamio, Osaka (JP); Noboru Takeuchi, Kyoto (JP); Kenichi Itou, Osaka (JP); Toshiyuki Fukuda, Kyoto (JP); Hideki Sakota, Kyoto (JP)

(73) Assignee: Panasonic Corporation, Osaka (JP)

( * ) Notice: Subject to any disclaimer, the term of this patent is extended or adjusted under 35 U.S.C. 154(b) by 631 days.

(21) Appl. No.: 11/607,001

(22) Filed: Dec. 1, 2006

(65) Prior Publication Data

US 2007/0158855 A1    Jul. 12, 2007

(30) Foreign Application Priority Data

Jan. 6, 2006    (JP)    ............................. 2006-001586

(51) Int. Cl.
  *H01L 21/48*    (2006.01)
(52) U.S. Cl. .................. 257/688; 257/692; 257/698; 257/E23.037
(58) Field of Classification Search .............. 257/688, 257/692, 698, E23.037
See application file for complete search history.

(56) References Cited

U.S. PATENT DOCUMENTS

| | | | | |
|---|---|---|---|---|
| 3,978,248 A | * | 8/1976 | Usami | ........................ 438/106 |
| 5,173,766 A | * | 12/1992 | Long et al. | ................... 257/687 |
| 5,216,278 A | * | 6/1993 | Lin et al. | ..................... 257/688 |
| 5,639,989 A | * | 6/1997 | Higgins, III | ................ 174/386 |
| 5,767,447 A | * | 6/1998 | Dudderar et al. | ............ 174/546 |
| 5,973,337 A | * | 10/1999 | Knapp et al. | ................... 257/99 |
| 6,348,729 B1 | * | 2/2002 | Li et al. | ....................... 257/691 |
| 6,392,294 B1 | * | 5/2002 | Yamaguchi | .................. 257/690 |
| 7,113,054 B2 | * | 9/2006 | Riondet et al. | ................. 333/32 |
| 2005/0263873 A1 | * | 12/2005 | Shoji | .......................... 257/698 |

FOREIGN PATENT DOCUMENTS

JP    2002-329807    11/2002
JP    2005-136329    5/2005

* cited by examiner

*Primary Examiner*—Eugene Lee
(74) *Attorney, Agent, or Firm*—McDermott Will & Emery LLP

(57) ABSTRACT

A semiconductor-element mounting substrate is a substrate for mounting a semiconductor element, and includes a substrate body. The substrate body has a mounting surface, and the center portion of the mounting surface is provided with a die pattern. Through conductors are provided in a portion of the substrate body located outside the die pattern to penetrate the substrate body in the thicknesswise direction. First terminals and second terminals are connected to the through conductors, respectively. The first terminals each extend toward the outer edge of the mounting surface, and they are electrically connected to the semiconductor element. The second terminals are provided on a surface of the substrate body opposite to the mounting surface.

19 Claims, 11 Drawing Sheets

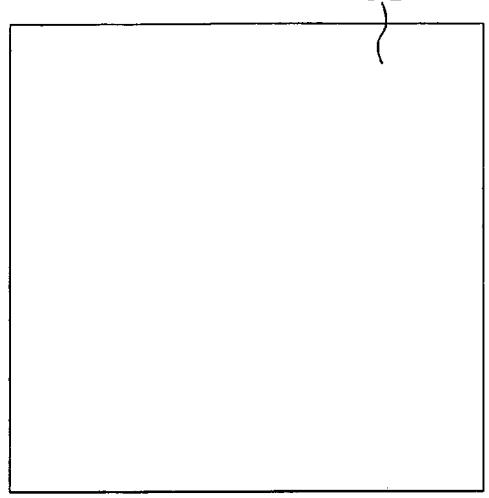
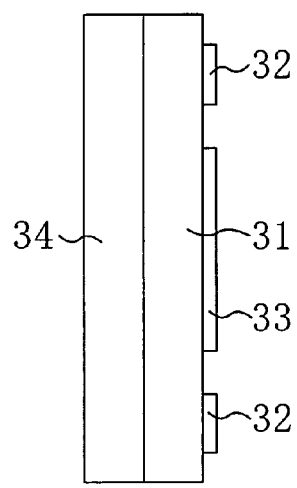
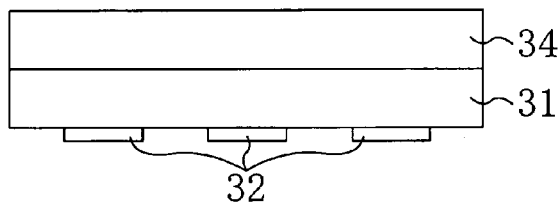
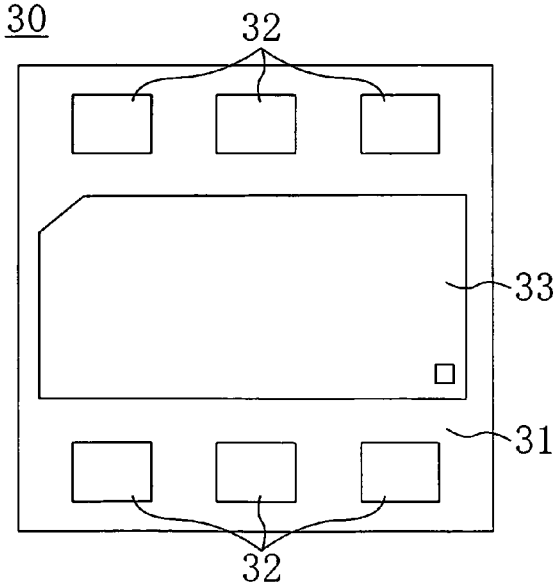

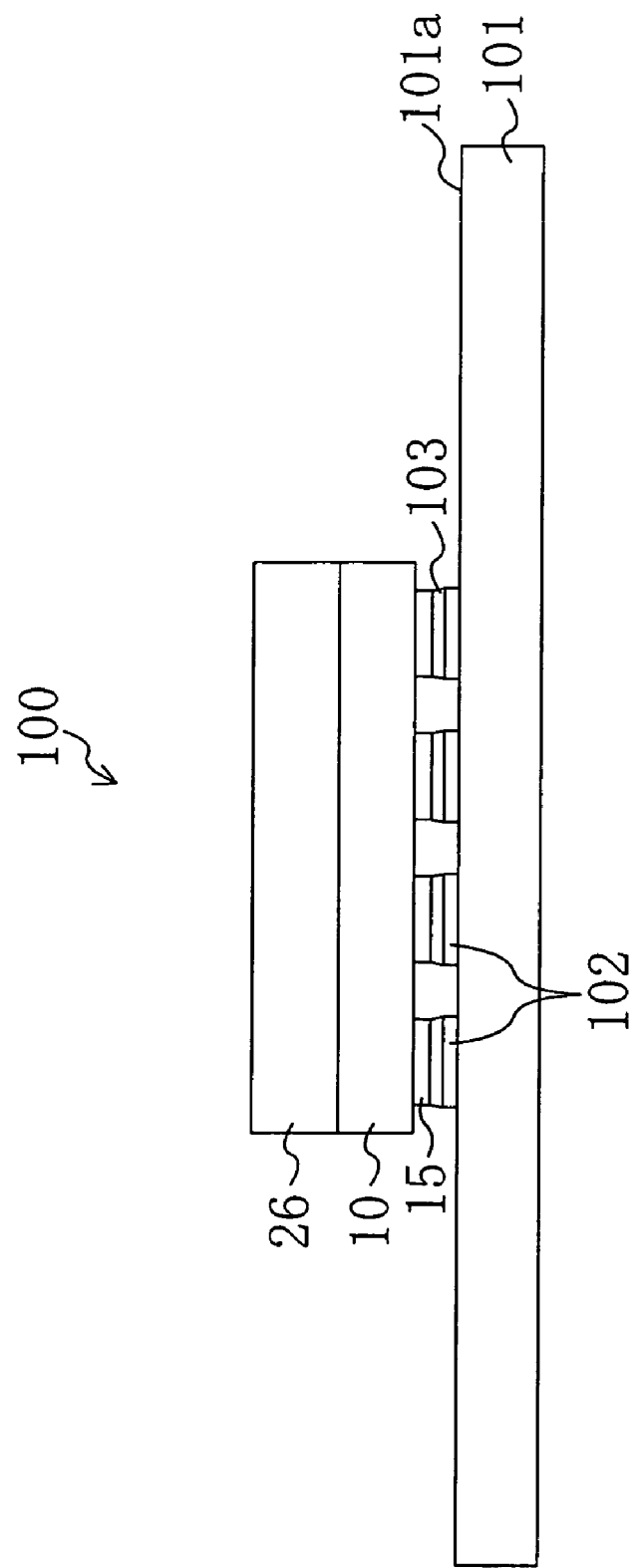

SEMICONDUCTOR-ELEMENT MOUNTING SUBSTRATE, SEMICONDUCTOR DEVICE, AND ELECTRONIC EQUIPMENT

CROSS-REFERENCE TO RELATED APPLICATIONS

This application claims priority under 35 U.S.C. §119 on Patent Application No. 2006-1586 filed in Japan on Jan. 6, 2006, the entire contents of which are hereby incorporated by reference.

BACKGROUND OF THE INVENTION (a) Fields of the Invention

The present invention relates to semiconductor-element mounting substrates for mounting semiconductor elements (referred hereinafter to as IC chips), semiconductor devices, and electronic equipment.

(b) Description of Related Art

With a recent trend toward high-density mounting of IC chips, resin-sealed semiconductor devices with a great number of electrodes have been developed. In mounting IC chips to surface mount type semiconductor devices of these types, large stress is generated between the IC chip and a die pattern because a resin substrate greatly differs in thermal expansion coefficient from sealing resin and a gold-plated copper pattern serving as the die pattern. This stress warps the resin substrate. As a result of this, the IC chip exfoliates from the die pattern to degrade the reliability of the semiconductor device, which has conventionally been a problem. Here is a list of the thermal expansion coefficients of the resin substrate, the die pattern, and the sealing resin: glass epoxy resin commonly employed as the resin substrate has a thermal expansion coefficient of 14 ppm/° C.; thermosetting resin employed for the sealing resin has a thermal expansion coefficient of 16 ppm/° C.; and a copper pattern generally employed as the die pattern has a thermal expansion coefficient of 17 ppm/° C. As shown in this list, since the thermal expansion coefficient of the resin substrate differs from those of the die pattern and the sealing resin, large stress is generated between the IC chip and the die pattern.

In addition, the IC chip is bonded to the die pattern through a die bonding material made of, for example, epoxy resin-based conductive adhesive. According to the material used for the target to be bonded, the adhesive strength of the die bonding material varies greatly. For example, it is known that if the IC chip is bonded through the die bonding material to a gold-plated film formed on the surface of the die pattern, the adhesive strength of the die bonding material is small. However, typically, on the surface of the die pattern, formation of the gold-plated film is required. Therefore, if the IC chip is bonded onto this gold-plated film with conductive adhesive as a die bonding material, the IC chip is likely to exfoliate during a fabrication process of the semiconductor device or during the step of solder-reflow mounting of the semiconductor device to a circuit board. Such exfoliation causes breaks in wire-bonded wire leads or traces of an interconnection pattern to seriously damage the reliability of the semiconductor device. In particular, such exfoliation of the IC chip occurs more noticeably as the size of the IC chip relative to the size of a package increases.

As an approach to addressing the above-mentioned problem of degradation in the reliability of the semiconductor device, for example, a semiconductor device having the structure shown below is disclosed (see, for example, Japanese Unexamined Patent Publication No. 2002-329807 (referred hereinafter to as Document 1)). The semiconductor device includes: a resin substrate; a die pattern formed on the resin substrate; an interconnection pattern formed around the die pattern; an IC chip mounted above the die pattern; and a thin conductive wire connecting the IC chip and the interconnection pattern. The die pattern has a main pattern, a bonding pattern, and a joining pattern. The main pattern has a smaller outer size than the IC chip. The bonding pattern is arranged outside the mounting position of the IC chip. The joining pattern connects the main pattern and the bonding pattern. The resin substrate has an insulative coating at least at the corners of the IC chip and corresponding portions.

Document 1 discloses the following approach as the advantage of the semiconductor device shown above. The thermal expansion coefficient of the resin substrate differs from those of the die pattern and the sealing resin. Thereby, even though thermal strain is concentrated at the corners of the IC chip, the corners are bonded through the die bonding material to the insulative coating with a large adhesive strength. This prevents the corners of the IC chip from exfoliating from the resin substrate, which significantly improves the reliability of the semiconductor device.

For example, Japanese Unexamined Patent Publication No. 2005-136329 (referred hereinafter to as Document 2) discloses a semiconductor device having the structure shown below. The main surface of a substrate is formed with a first region, a second region surrounding the first region, and a third region surrounding the second region. The first region is provided with a first insulative coating with no corners. The top of the first insulative coating is provided with an IC chip. The IC chip is covered with sealing resin. The third region of the substrate is provided with a second insulative coating. The bottom surface of the IC chip covers the first region.

In the case of the semiconductor device having this structure, the insulative coating is provided only over the first region and the third region, and not provided over a region immediately below the outer edge of the IC chip and its vicinity. Document 2 discloses the following fact: a main factor behind interconnection breaks is that according to temperature cycling, stress is repeatedly applied to the insulative coating arranged over the outer edge region of the IC chip and its vicinity, and however the semiconductor device having the structure shown above can reduce the stress applied to the insulative coating in this region to avoid interconnection breaks.

SUMMARY OF THE INVENTION

To solve the problems described above, a semiconductor-element mounting substrate according to the present invention includes: a substrate body having a mounting surface above which a semiconductor element is mounted; a placing unit provided on the mounting surface and placing the semiconductor element; a plurality of through conductors provided in a portion of the substrate body located outside the placing unit to penetrate the substrate body in the thicknesswise direction; a plurality of first terminals which are provided on the mounting surface to extend from the through conductors toward the outer edge of the mounting surface and which are electrically connected to the semiconductor element; and a plurality of second terminals which are provided on a surface of the substrate body opposite to the mounting surface and which are connected to the through conductors to make electrical connection to the first terminals, respectively.

With this structure, the first terminals for connecting wire leads by wire bonding are arranged closer to the outer edge of the mounting surface than the through conductors, respectively. With this arrangement, even though a portion of the IC chip (the semiconductor element) exfoliates from the die pattern during heat cycling or the like, it becomes difficult for stress of sealing resin to further affect the first terminals. This makes it difficult to cause breaks in the wire leads or the first terminals, thereby providing the semiconductor-element mounting substrate capable of improving the reliability of the semiconductor device.

A semiconductor device according to the present invention is a semiconductor device in which a semiconductor element is mounted to a semiconductor-element mounting substrate. The semiconductor-element mounting substrate includes: a substrate body having a mounting surface above which a semiconductor element is mounted; a placing unit provided on the mounting surface and placing the semiconductor element; a plurality of through conductors provided in a portion of the substrate body located outside the placing unit to penetrate the substrate body in the thicknesswise direction; a plurality of first terminals which are provided on the mounting surface to extend from the through conductors toward the outer edge of the mounting surface and which are electrically connected to the semiconductor element; and a plurality of second terminals which are provided on a surface of the substrate body opposite to the mounting surface and which are connected to the through conductors to make electrical connection to the first terminals, respectively.

With this structure, the first terminals for connecting wire leads by wire bonding are arranged closer to the outer edge of the mounting surface than the through conductors, respectively. With this arrangement, even though a portion of the IC chip (the semiconductor element) exfoliates from the die pattern during heat cycling or the like, it becomes difficult for stress of sealing resin to further affect the first terminals. This makes it difficult to cause breaks in the wire leads or the first terminals, thereby improving the reliability of the semiconductor device.

Electronic equipment according to the present invention includes the semiconductor device of the present invention. With this structure, the reliability of the electronic equipment can be further improved. As the electronic equipment, cellular telephones, PDAs with communication facilities, or the like are preferable.

BRIEF DESCRIPTION OF THE DRAWINGS

FIG. 3A is a top view of a power amplifier circuit module in which a semiconductor chip of silicon and a semiconductor chip of gallium arsenide are used as IC chips.

FIG. 3B is a right side view of the power amplifier circuit module shown in FIG. 3A.

FIG. 3C is a front view of the power amplifier circuit module shown in FIG. 3A.

FIG. 3D is a bottom view of the power amplifier circuit module shown in FIG. 3A.

FIG. 9 is a side view of electronic equipment according to the present invention.

DETAILED DESCRIPTION OF THE PREFERRED EMBODIMENTS

Figure 1A:
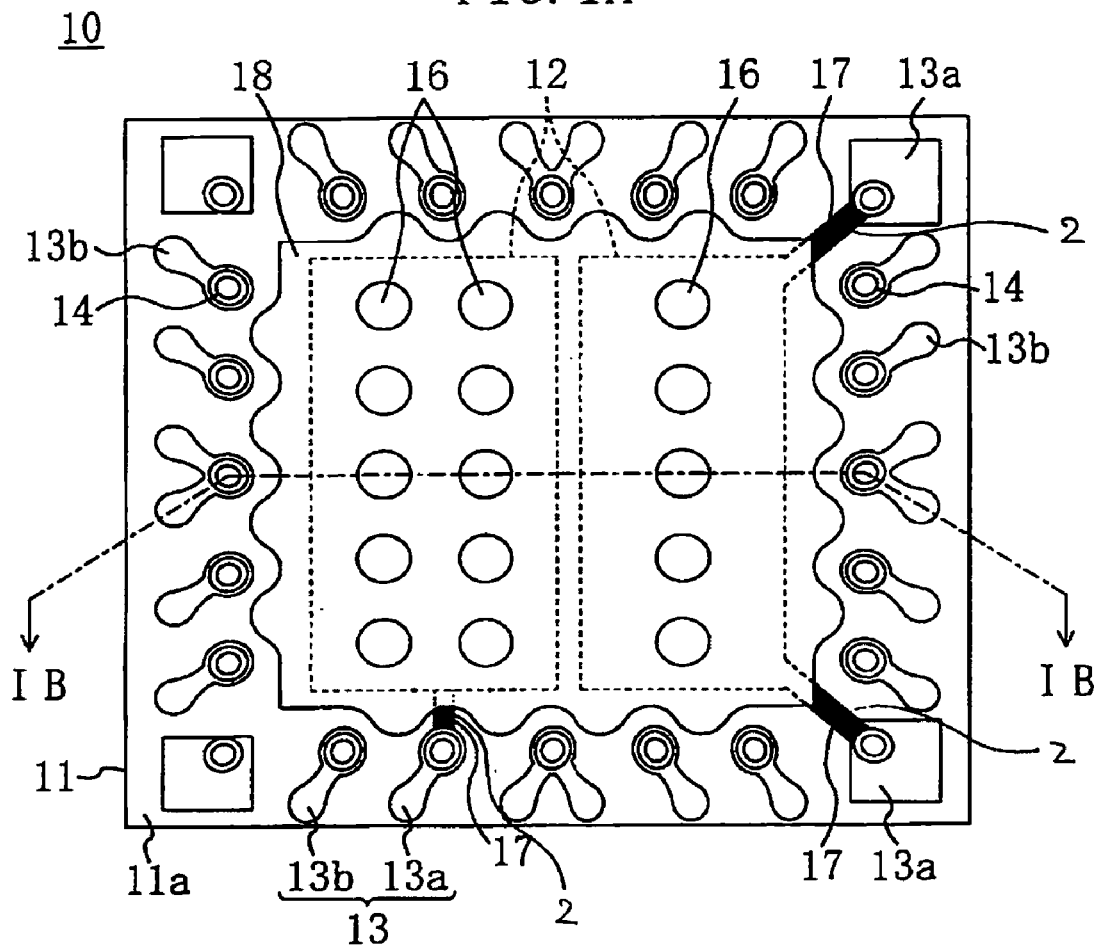
FIG. 1A is a plan view showing the structure of a semiconductor-element mounting substrate according to a first embodiment of the present invention.

According to the technology disclosed in Document 1 shown above, the insulative coating is formed over a portion of the die pattern located at a position corresponding to each corner of the IC chip. Thus, the corner is bonded through the die bonding material to the insulative coating having a large adhesive strength, which provides an enhanced adhesive strength of the corner of the IC chip. However, in the technology disclosed in Document 1, since the IC chip is bonded to the die pattern, a region where the conductive adhesive is applied to the IC chip increases. This makes it difficult to increase the adhesive strength of the overall IC chip to the die pattern. In particular, in the case of the IC chip with a large size, the degree of decrease in the adhesive strength of the overall IC chip to the die pattern becomes more significant. Thus, if the IC chip is repeatedly subjected to heat cycling or the like, the IC chip may exfoliate from the die pattern to cause breaks in wire leads or the like.

According to the technology disclosed in Document 2 shown above, the insulative protective film is not formed over a region immediately below the outer edge of the IC chip and its vicinity, and thus in this region, the IC chip is bonded directly to die pattern through the die bonding material. This reduces the stress. On the one hand, in the region immediately below the outer edge of the IC chip and its vicinity, the adhesive strength of the IC chip to the die pattern is small. Thus, if the semiconductor device is mounted by a solder reflow to a circuit board or repeatedly subjected to heat cycling, the IC chip may exfoliate from the die pattern. If such exfoliation occurs, stress from the sealing resin sometimes warps the substrate to break the wire lead or the interconnection wire. From these points, it is conceivable that the technologies disclosed in Documents 1 and 2 shown previously will have the problems particularly about the reliability.

The present invention has been made to solve the problems described above, and an object thereof is to provide a semiconductor-element mounting substrate in which even though it is subjected to heat cycling during fabrication and operation, exfoliation of an IC chip can be eliminated to prevent breaks in wire leads, interconnects, and the like, and to provide a semiconductor device and electronic equipment employing the semiconductor-element mounting substrate to attain a high reliability.

Hereinafter, embodiments of the present invention will be described with reference to the accompanying drawings. Note that the present invention is not limited to the embodiments that follow. In the following description, the same components are assigned the same reference numerals, and the corresponding description is omitted in some cases. For the sake of easier understanding of the drawings, electrode terminals of an IC chip, first and second terminals of a semiconductor-element mounting substrate, and wire leads are shown in fewer numbers than the actual numbers, so that the numbers of them are not limited to those shown in the drawings.

First Embodiment

Figure 1B:
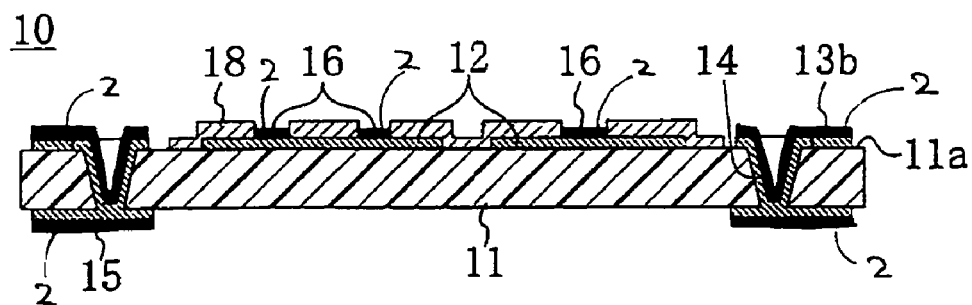
FIG. 1B is a sectional view of the substrate taken along the line IB-IB in FIG. 1A.

FIG. 1 shows the structure of a semiconductor-element mounting substrate 10 according to a first embodiment of the present invention. FIG. 1A is a plan view of the semiconductor-element mounting substrate 10, and FIG. 1B is a sectional view thereof taken along the line IB-IB in FIG. 1A.

First description is made of the structure of the semiconductor-element mounting substrate 10.

The semiconductor-element mounting substrate 10 is a substrate for mounting IC chips (no shown in FIG. 1) 21 and 22, and as shown in FIG. 1, it includes: a substrate body 11; die patterns 12 and 12; a plurality of first terminals 13, 13, . . . ; a plurality of through conductors 14, 14, . . . ; a plurality of second terminals 15, 15, . . . ; and an insulative coating 18.

The substrate body 11 is made of an insulative member. As the substrate body 11, use can be made of various resin substrates, for example, a substrate made by impregnating a fiber of organic compound, such as a glass fiber or Kevlar (registered trademark), with epoxy resin, phenolic resin, polyimide resin, or the like and curing the impregnated fiber, or a substrate made of BT resin. In the first embodiment, description is made of an exemplary case where a substrate of BT resin is used as the substrate body 11. The substrate body 11 also has a mounting surface 11a for mounting the IC chips 21 and 22.

The die patterns 12 and 12 are formed of, for example, copper foils provided on the mounting surface 11a, and they are electrically connected to the IC chips 21 and 22, respectively. In other words, as described later, the IC chips 21 and 22 are placed on the die patterns 12 and 12, respectively.

Note that the two die patterns 12 and 12 are provided in order to place the two IC chips 21 and 22, respectively. However, the two IC chips 21 and 22 can also be placed on one die pattern. Therefore, the number of die patterns can be determined without being limited to the number of IC chips placed.

The through conductors 14 are provided outside the die patterns 12 and 12 to penetrate the substrate body 11 in the thicknesswise direction, and spaced at regular intervals.

The first terminals 13, 13, . . . include first grounding terminals 13a, 13a, . . . and first electrically-connecting terminals 13b, 13b, . . . , respectively. These terminals 13a, 13a, . . . and 13b, 13b, . . . are provided to extend from the through conductors 14, 14, . . . toward the outer edge of the mounting surface 11a, and arranged radically from the die patterns (to be more specific, from the center of the die pattern area). As shown above, the first terminals 13, 13, . . . are arranged outside the through conductors 14, 14, . . . , respectively. With this arrangement, even though the IC chips 21 and 22 placed above the die patterns 12 exfoliates due to heat, the exfoliation can be blocked at the positions of the through conductors 14, 14, . . . .

The first grounding terminals 13a, 13a, . . . are terminals for grounding the associated IC chips 21 and 22, and they are electrically connected through conductive interconnects 17, 17, . . . to the die patterns 12, respectively. Specifically, the first grounding terminals 13a, 13a, . . . are electrically connected through the conductive interconnects 17, 17, . . . and the die patterns 12 to the IC chips 21 and 22 placed above the die patterns 12, respectively, thereby grounding the IC chips 21 and 22.

The first electrically-connecting terminals 13b, 13b, . . . are terminals for supplying starting power to the associated IC chips 21 and 22, and they are electrically connected through wire leads 25, 25, . . . to be described later to electrode terminals 23, 23, . . . of the IC chips 21 and 22, respectively.

The second terminals 15 are terminals for applying external voltage. They are provided on the surface of the substrate opposite to the mounting surface 11a, and connected to the through conductors 14, respectively. To be more specific, the second terminals 15, 15, . . . are electrically connected through the through conductors 14, 14, . . . , the first electrically-connecting terminals 13b, 13b, . . . , and the wire leads 25, 25, . . . to the electrode terminals 23, 23, . . . of the IC chips 21 and 22 placed above the die pattern 12, respectively, thereby supplying starting power to the IC chips 21 and 22.

The insulative coating 18 is made of a photosensitive resin material, and preferably applied using a photolithography process and an etching process. The insulative coating 18 is provided to expand from the die patterns 12 to the verge of the through conductors 14, 14, . . . , to be more specific, provided over the die patterns 12 and the surrounding of the die patterns 12. With this structure, in the case where the IC chips 21 and 22 are mounted to the semiconductor-element mounting substrate 10 to fabricate the resin-sealed semiconductor device, sealing resin 26 (which is resin for sealing the IC chips 21 and 22 illustrated in FIG. 2B) can be bonded to the insulative coating 18 to prevent exfoliation of the IC chips 21 and 22. Moreover, since the insulative coating 18 is provided to the die patterns 12, the IC chips 21 and 22 to be placed can be fixed to the die patterns 12 more firmly than the case where the insulative coating is not provided to the die patterns.

A portion of the insulative coating 18 provided over the die patterns 12 is provided with holes 16, 16, . . . . The holes 16, 16, . . . penetrate the insulative coating 18 in the thicknesswise direction. As a result of provision of the holes 16, 16, . . . , the die patterns 12 are partly exposed. Thus, provision of the holes 16, 16, . . . can reduce stress of the insulative coating 18 and moisture absorption in the insulative coating 18. If the IC chips 21 and 22 are placed above the die patterns 12, the IC chips 21 and 22 can be electrically conducted through conductive adhesive 24 to be described later to the die patterns 12, respectively.

As shown in FIGS. 1A and 1B, a gold thin film (gold film) 2 is provided on portions of the die patterns 12 not provided with the insulative coating 18, the first terminals 13, the through conductors 14, the second terminals 15, and the conductive interconnects 17. Preferably, the gold thin film is formed in the manner in which nickel plating is performed on a copper pattern and gold plating is performed on the nickel-plated pattern. This prevents corrosion of the portions provided with the gold thin film. Moreover, in a wire bonding that will be described later, the wire leads 25, 25, . . . can be bonded firmly to the first terminals 13, 13, . . . , respectively.

Next description is made of a fabrication method of the semiconductor-element mounting substrate 10.

First, for example, a copper foil is stuck onto the surface of the substrate body 11 made of BT resin. Using a photolithography process and an etching process, the foil is formed into a predetermined pattern.

To be more specific, first, for example, a copper foil with a thickness of about 18 μm is stuck onto the both surfaces of the substrate body 11 of BT resin having a thickness of about 0.2 mm. Next, the substrate body 11 is subjected to a piercing process for forming a penetrating hole. Thereafter, by electroless copper plating and electrolytic copper plating, a copper-plated layer (not shown) is formed on the surfaces of the resin substrate 11 having copper stuck onto the both surfaces. In this process, the copper-plated layer is also provided on the inside of the penetrating hole. A photolithography process and an etching process can be carried out to provide the die patterns 12, the first terminals 13, 13, . . . , the through conductors 14, 14, . . . , the second terminals 15, 15, . . . , and the conductive interconnects 17, 17, . . . as shown in FIG. 1.

Subsequently, for example, lamination with a plating resist film is made and a photolithography process and an etching process are carried out to form the insulative coating 18 as shown in FIG. 1. Specifically, the insulative coating 18 is provided to expand from the die patterns 12 to the verge of the through conductors 14, 14, . . . .

In this process, the insulative coating 18 may be formed not using such a plating resist film but using, for example, a liquid material such as development-type liquid solder resist. Alternatively, it may be formed using non-photosensitive, thermosetting solder resist (which may be made of either a polyimide resin-based material or an epoxy resin-based material), ultraviolet-cured acrylate-based resin, a polyimide tape with adhesive, or the like.

Although the holes 16, 16, . . . are set to be formed in the portion of the insulative coating 18 located over the die patterns 12, they may be formed also in a portion of the insulative coating 18 located over the surrounding of the die patterns. The holes 16, 16, . . . can be formed to reduce stress of the insulative coating 18, which not only reduces warp of the substrate body 11 but also suppresses exfoliation of the IC chips 21 and 22. Note that the number of holes 16 is not limited to the number thereof illustrated in FIG. 1A. In the manner described above, the semiconductor-element mounting substrate 10 can be provided.

Here is a summary of the effects exerted by the semiconductor-element mounting substrate 10.

As described above, even though the IC chips 21 and 22 placed above the die patterns 12 exfoliate from the die patterns 12, the exfoliation can be blocked at the positions of the through conductors 14, 14, . . . , thereby preventing further exfoliation thereof to the first terminals 13, 13, . . . . As a result of this, the first terminals 13, 13, . . . and the conductive interconnects 17, 17, . . . can be prevented from being disconnected. Moreover, when the wire leads 25, 25, . . . electrically connect the first electrically-connecting terminals 13b, 13b, . . . to the electrode terminals 23, 23, . . . of the IC chips 21 and 22, respectively, the wire leads 25, 25, . . . can be prevented from being disconnected from the first electrically-connecting terminals 13b, 13b, . . . and the electrode terminals 23, 23, . . . of the IC chips 21 and 22. Therefore, by forming a resin-sealed semiconductor device using the semiconductor-element mounting substrate 10 of this structure, the resin-sealed semiconductor device resistant to disconnection of the wire leads 25, 25, . . . during operation and the like can be provided, and thereby a semiconductor device can be provided which has a higher reliability than a resin-sealed semiconductor device fabricated using the conventional semiconductor-element mounting substrate.

Furthermore, since the insulative coating 18 is provided around the die patterns, the IC chips 21 and 22 can be prevented from exfoliating from the die patterns 12.

Moreover, since the holes 16, 16, . . . are formed, stress of the insulative coating 18 can be reduced to prevent warp of the substrate body 11. Thus, the IC chips 21 and 22 placed above the die patterns 12 can be prevented from exfoliating from the die pattern 12.

Figure 2A:
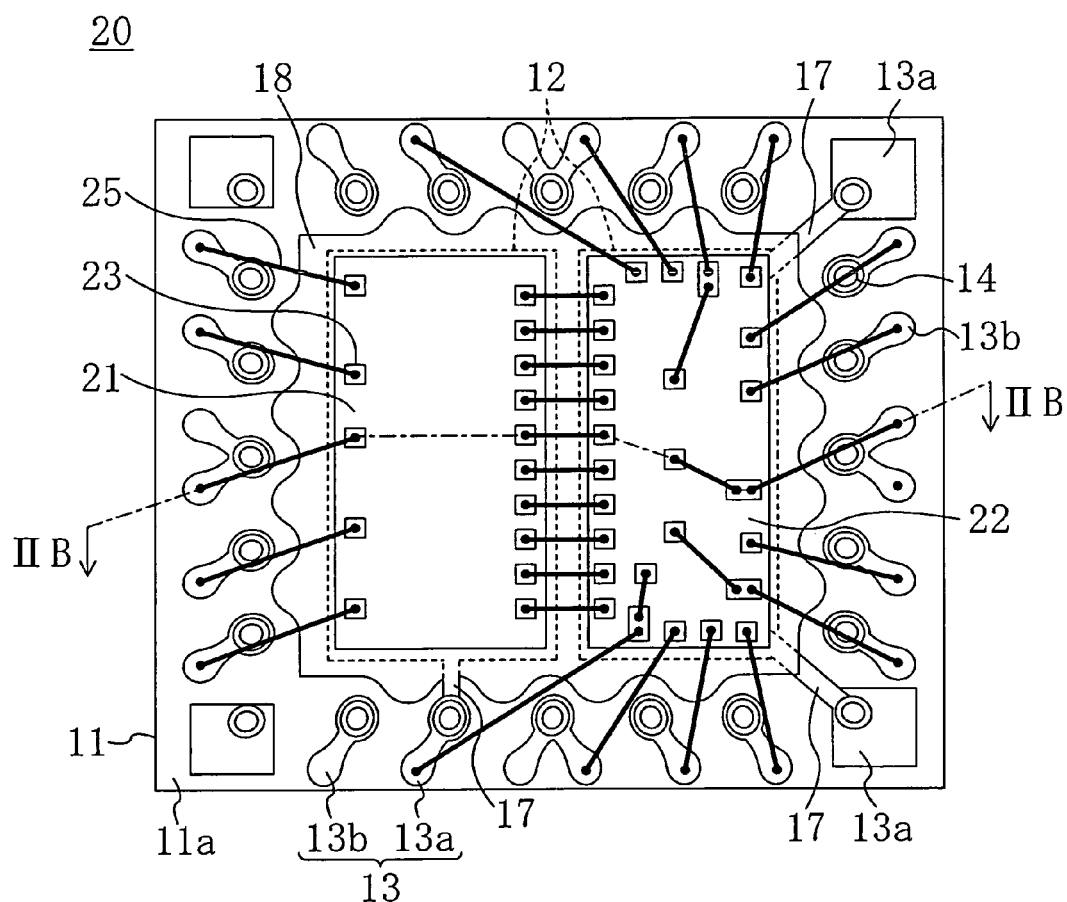
FIG. 2A is a plan view showing the structure of a semiconductor device according to the first embodiment of the present invention.
Figure 2B:
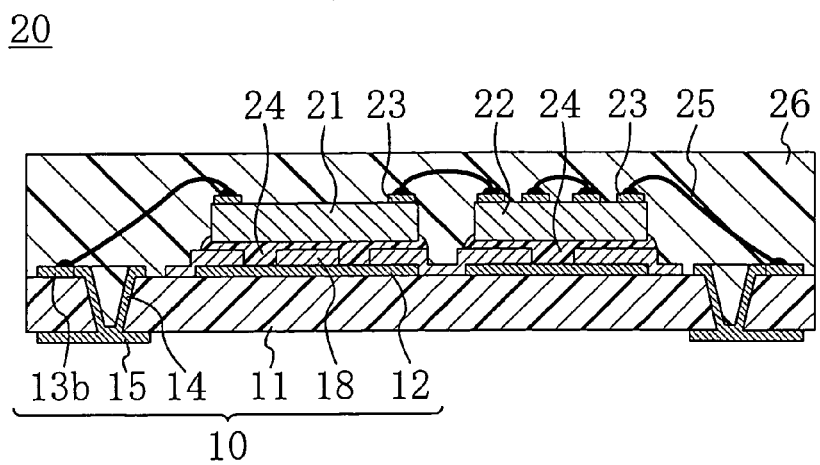
FIG. 2B is a sectional view of the device taken along the line IIB-IIB in FIG. 2A.

FIG. 2 illustrates a semiconductor device 20 exemplarily fabricated using the semiconductor-element mounting substrate 10. FIG. 2A is a plan view of the semiconductor device 20, and FIG. 2B is a sectional view thereof taken along the line IIB-IIB in FIG. 2A. Note that FIG. 2A shows the state of the device in which the sealing resin 26 is removed for the sake of easier understanding of the drawing.

First, the structure of the semiconductor device 20 is shown.

As shown in FIG. 2, the semiconductor device 20 includes: the IC chips 21 and 22; the semiconductor-element mounting substrate 10 described above; the wire leads 25, 25, . . . ; and the sealing resin 26. The wire leads 25, 25, . . . connect the electrode terminals 23, 23, . . . of the IC chips 21 and 22 to the first electrically-connecting terminals 13b, 13b, . . . of the semiconductor-element mounting substrate 10, respectively. The sealing resin 26 is applied onto the mounting surface 11a of the substrate body 11 to have the IC chips 21 and 22 and the wire leads 25 embedded therein.

The IC chips 21 and 22 are bonded through the conductive adhesive 24 to the insulative coating 18 and portions of the associated die patterns 12 exposed from the holes 16.

Next, a fabrication method of the semiconductor device 20 is shown.

First, the IC chips 21 and 22 are aligned with locations corresponding to the die patterns 12 of the semiconductor-element mounting substrate 10 shown in FIG. 1. In this state, through the epoxy-based conductive adhesive 24 with, for example, silver filler added therein, the chips are bonded to the insulative coating 18 and the portions of the associated die patterns 12 exposed from the holes 16.

Then, with the wire leads 25, 25, . . . , the electrode terminals 23, 23, . . . of the IC chips 21 and 22 are connected to the first electrically-connecting terminals 13b, 13b, . . . , respectively. Preferably, a gold wire is used as the wire lead 25. With this procedure, electric connection between the semiconductor-element mounting substrate 10 and the IC chips 21 and 22 is established. Then, an external voltage is applied to the second terminals 15, 15, . . . to conduct electrical inspections on the semiconductor device 20.

Subsequently, using a sealing resin material such as thermosetting resin, for example, epoxy-based resin employing silica for filler, resin sealing is performed to embed the IC chips 21 and 22 and the wire leads 25, 25, . . . . In this sealing, the sealing resin 26 also fills the openings of the through conductors 14, whereby the adhesion between the semiconductor-element mounting substrate 10 and the sealing resin 26 can be made more firmly. In the manner described above, the semiconductor device 20 can be fabricated.

Since the semiconductor device 20 includes the semiconductor-element mounting substrate 10 described above, it can offer almost the same effects exerted by the semiconductor-element mounting substrate 10. To be more specific, even though partial exfoliation of the IC chips 21 and 22 occurs, further exfoliation is blocked by the through conductors 14 and the portion at which the insulative coating and the sealing resin are bonded. This prevents device failure resulting from breaks in the wire leads 25, 25, . . . , the first terminals 13, 13, . . . , the conductive interconnects 17, 17, and the like, thereby fabricating a highly reliable semiconductor device 20.

Moreover, provision of the holes 16, 16, . . . can reduce stress of the insulative coating 18 and moisture absorption in the insulative coating 18. This makes it difficult to cause exfoliation of the IC chips 21 and 22 due to a solder-reflow mounting process, heat cycling, or the like.

Furthermore, provision of the insulative coating 18 over the die patterns 12 can make the adhesive strength of the IC chips to the die patterns 12 and 12 higher than the case where the IC chips are bonded through the conductive adhesive to die patterns formed with only a gold thin film.

FIG. 9 is a side view of the structure of electronic equipment 100.

The electronic equipment 100 includes: a motherboard substrate 101; and the semiconductor mounting substrate 10 according to the first embodiment. A surface 101a of the motherboard substrate 101 is formed with a plurality of lands 102, 102, . . . to be spaced from each other. The semiconductor mounting substrate 10 is mounted to the motherboard substrate 100. Specifically, the second terminals 15, 15, . . . are electrically connected through solder pieces 103, 103, . . . to the plurality of lands 102, 102, . . . , respectively. In the semiconductor mounting substrate 10, a semiconductor element (not shown) is sealed with the sealing resin 26.

Next, a soldering heat resistance test was conducted, and from the result of this test, the effects of the semiconductor device 20 were verified. The verification result will now be described. To be more specific, on the semiconductor device 20 shown in FIG. 2 and a conventional semiconductor device 70 shown in FIG. 10, a soldering heat resistance test was conducted.

Figure 10A:
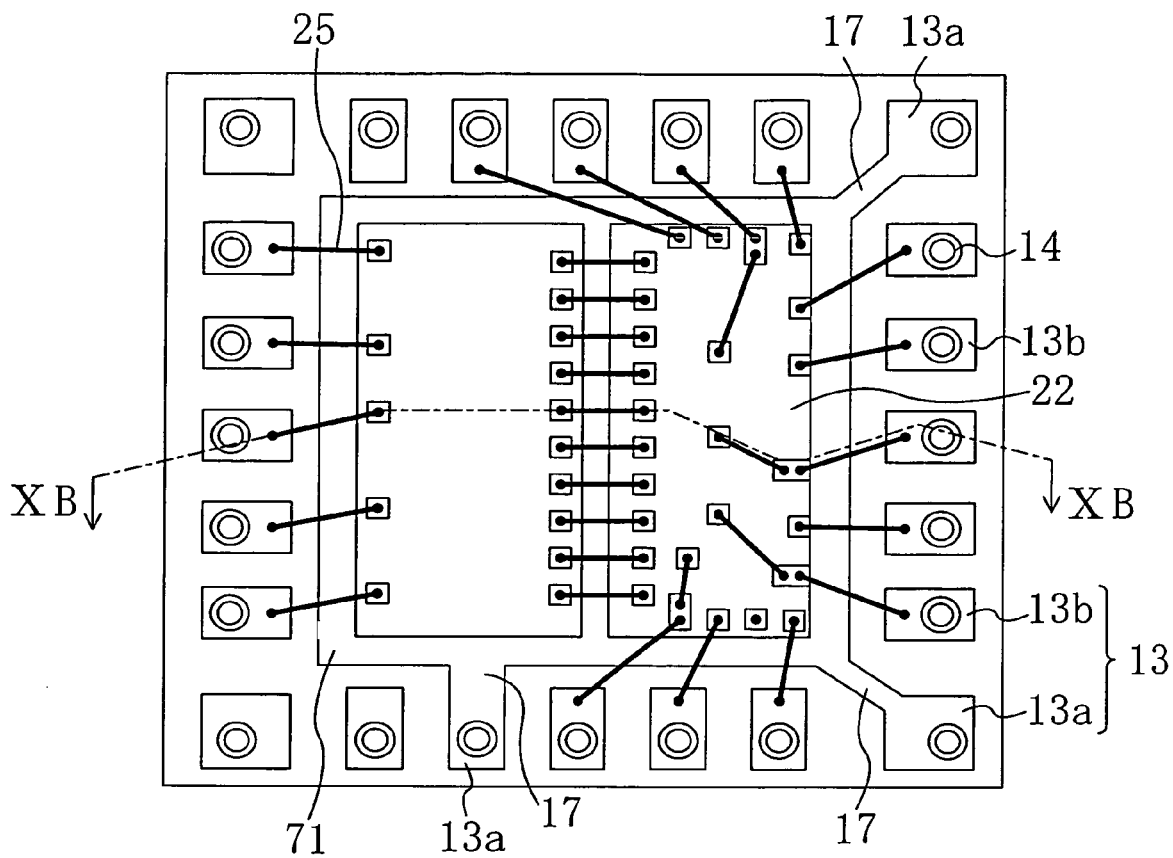
FIG. 10A is a top view of a power amplifier circuit module in which a semiconductor chip of silicon and a semiconductor chip of gallium arsenide are used as IC chips.
Figure 10B:
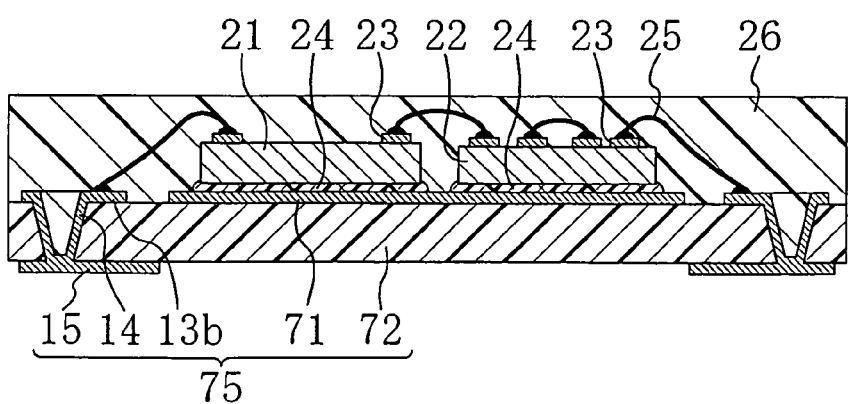
FIG. 10B is a sectional view of the module taken along the XB-XB shown in FIG. 10A.

Herein, the structure of the conventional semiconductor device 70 is shown in FIG. 10. FIG. 10A is a top view exemplarily showing a power amplifier circuit module as the semiconductor device, which is fabricated using a semiconductor chip of silicon and a semiconductor chip of gallium arsenide as the IC chips. FIG. 10B is a sectional view thereof taken along the line XB-XB in FIG. 10A. The conventional semiconductor device 70 has almost the same structure as the semiconductor device 20, and includes: the IC chips 21 and 22; a semiconductor-element mounting substrate 75; the wire leads 25, 25, . . . ; and the sealing resin 26.

The semiconductor-element mounting substrate 75 will be described briefly. The center portion of a mounting surface of a substrate body 72 is provided with a die pattern 71. In the perimeter portion of the mounting surface located outside the die pattern 71, a plurality of through conductors 14, 14, . . . penetrate the substrate in the thicknesswise direction. The first terminals 13, 13, . . . are provided to extend from the through conductors 14, 14, . . . toward the die pattern 71, respectively. The second terminals 15, 15, . . . are provided on a surface of the substrate opposite to the mounting surface, and connected to the through conductors 14, 14, . . . , respec-
tively. As is apparent from the above, the semiconductor-element mounting substrate 75 differs from the semiconductor-element mounting substrate 10 in the absence of the insulative coating and the direction in which the first terminals 13 extend from the through conductors along the mounting surface.

Here is how the soldering heat resistance test is conducted in the first embodiment. In this heat-resistance test, first, baking was performed at 100 to 130° C. for 10 to 20 hours. Next, moisture absorption was performed at 85° C. and 65% RH (relative humidity) for 10 to 24 hours. Subsequently, reflow heating was performed at 250 to 270° C. for 10 seconds, and then moisture absorption was performed at 85° C. and 65% RH for 10 to 24 hours. Then, reflow heating was performed at 250 to 270° C. for 10 seconds. After these procedures, by a SAT (Scanning Acoustic Tomograph) as an ultrasonic imaging device capable of nondestructively observing samples, the extent of exfoliation of the sealing resin 26 was checked. To be more specific, observation was made of whether the sealing resin 26 exfoliates from the first grounding terminal 13a and the first electrically-connecting terminal 13b of the semiconductor-element mounting substrate 10, or whether the sealing resin 26 exfoliates from the first grounding terminal 13a and the first electrically-connecting terminal 13b of the semiconductor-element mounting substrate 75. The result of the observation is shown in Table 1.

TABLE 1

| | Exfoliation Frequency/Number of Tests [count] | |
|---|---|---|
| | Example of the Invention (FIG. 2) | Comparative Example (FIG. 10) |
| Exfoliation at First Grounding Terminal | 1/12 | 12/12 |
| Exfoliation at First Electrically-connecting Terminal | 0/12 | 12/12 |

Referring to Table 1, for the conventional semiconductor device 70, it was observed that in all of 12 tested areas in this device, the sealing resin exfoliated both at the first grounding terminals 13a and at the first electrically-connecting terminals 13b.

Figure 11:
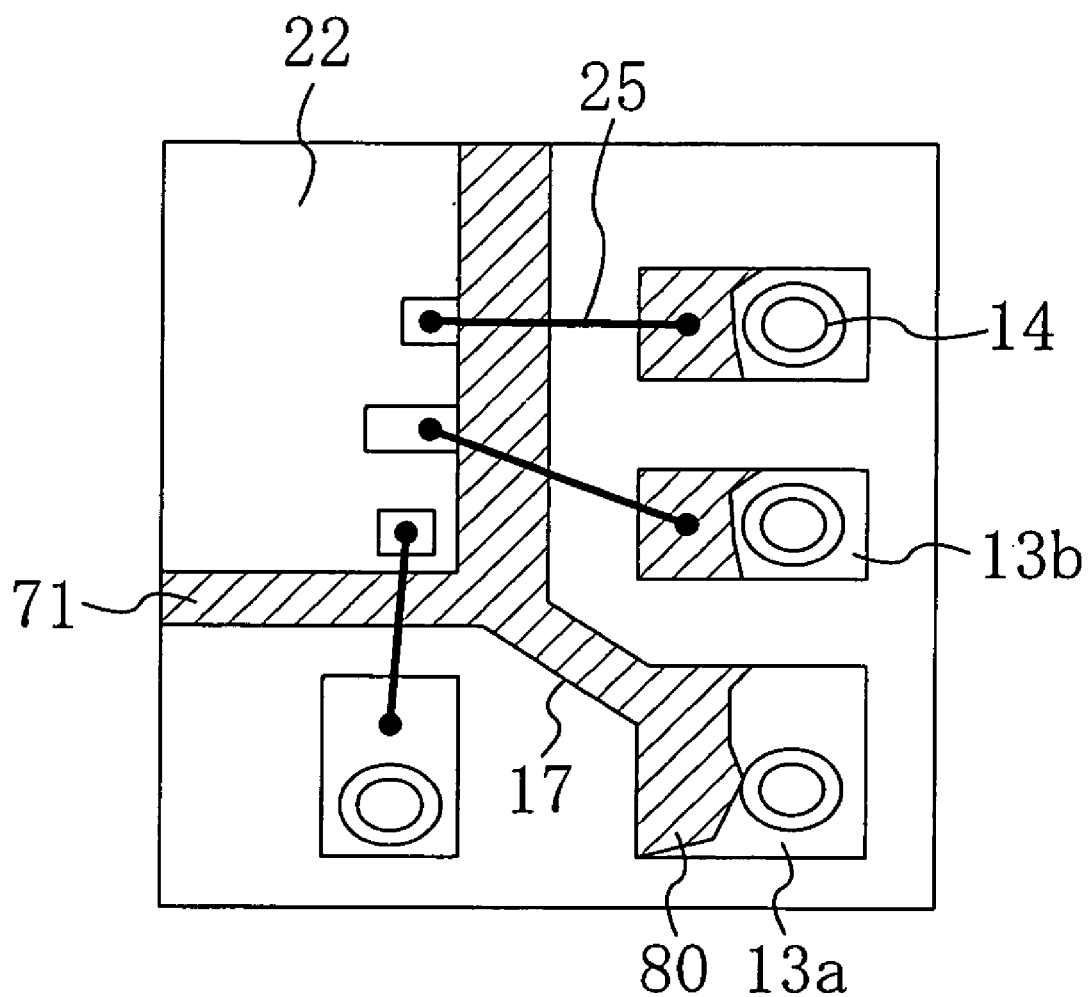
FIG. 11 is a view schematically showing the points of exfoliation of the conventional semiconductor device shown in FIG. 10 which occur when a soldering heat resistance test was conducted on the device.

FIG. 11 schematically shows the points of exfoliation of the conventional semiconductor device 70 shown in FIG. 10 which occur when the soldering heat resistance test was conducted on the device. From the result shown in FIG. 11, findings about progression of the exfoliation are as follows. Specifically, the exfoliation first occurs at the die pattern 71 located immediately below the IC chip 22, then proceeds to the conductive interconnect 17, and finally reaches the first grounding terminal 13a. Simultaneously with this, the exfoliation also occurs at the first electrically-connecting terminal 13b in the vicinity of the die pattern 71.

On the other hand, for the semiconductor device 20, as shown in Table 1, it was observed that in 12 tested areas in this device, the sealing resin exfoliated at only one of the first grounding terminals 13a and at none of the first electrically-connecting terminals 13b. From this result, the following can be considered. The first terminals 13 are provided closer to the outer edge portion of the mounting surface than the through conductors 14. Therefore, progression of the exfoliation described above stops at the point at which the insulative coating 18 is bonded to the sealing resin 26 or the through conductors 14, and cannot further reach the first terminals 13. Moreover, since the sealing resin is bonded to the portion of the insulative coating provided over the surrounding of the die pattern, the occurrence of the above-described exfoliation can be prevented. With such a structure, in the semiconductor device 20, degradation of mechanical strength and electrical characteristics or occurrence of breaks or the like in the wire leads 25, 25, . . . can be prevented.

FIG. 3 illustrates an outline structure of an exemplary power amplifier circuit module 30 as a semiconductor device, which is fabricated using a semiconductor chip of silicon and a semiconductor chip of gallium arsenide as IC chips. FIGS. 3A, 3B, 3C, and 3D are top, right-side, front, and bottom views of the power amplifier circuit module 30, respectively. The power amplifier circuit module 30 includes a semiconductor-element mounting substrate 31 which has almost the same inner structure as the semiconductor-element mounting substrate 10 described above. However, as shown in FIG. 3D, the semiconductor-element mounting substrate 31 is characterized in that second terminals 32, 32, . . . are provided along two sides of the back surface of the substrate body and a first grounding terminal 33 is provided at the center portion of the back surface of the substrate body.

The substrate body is made of BT resin. A sealing resin 34 is made of epoxy resin. A first electrically-connecting terminal (not shown), a die pattern (not shown), the second terminals 32, 32, . . . , and the first grounding terminal 33 are formed at their surfaces with electroless gold plating. The outside dimensions of the power amplifier circuit module 30 are 4 mm×4 mm×1.2 mm. The power amplifier circuit module 30 having such a structure was fabricated and then tested for heat resistance to solder reflow. The result of this test was that the number of defective portions was zero. Moreover, a heat cycling test was conducted on this power amplifier circuit module 30. From the result of this test, it was observed that this power amplifier circuit module has a good reliability. Note that such a power amplifier circuit module 30 can be employed for a power amplifier circuit of a cellular telephone or the like.

Second Embodiment

Figure 4A:
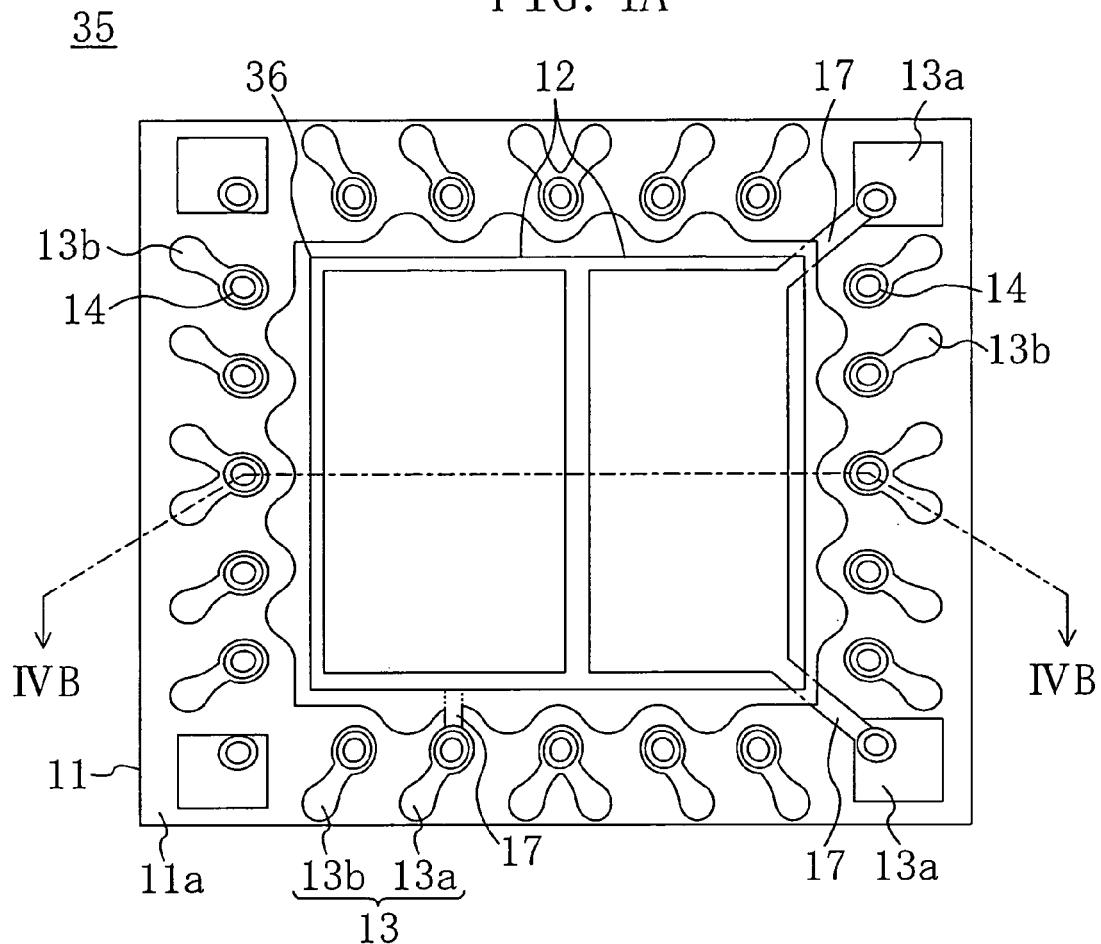
FIG. 4A is a plan view showing the structure of a semiconductor-element mounting substrate according to a second embodiment of the present invention.
Figure 4B:
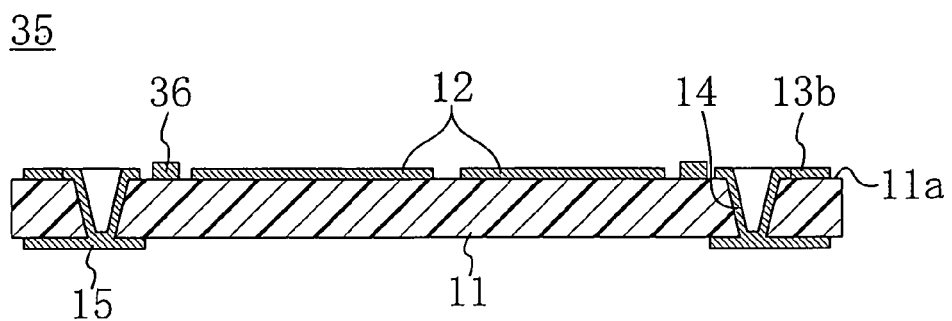
FIG. 4B is a sectional view of the substrate taken along the line IVB-IVB in FIG. 4A.

FIG. 4 shows the structure of a semiconductor-element mounting substrate 35 according to a second embodiment. FIG. 4A is a plan view of the semiconductor-element mounting substrate 35, and FIG. 4B is a sectional view thereof taken along the line IVB-IVB in FIG. 4A.

As compared to the semiconductor-element mounting substrate 10 of the first embodiment, the semiconductor-element mounting substrate 35 of the second embodiment is characterized in that the geometry of an insulative coating 36 differs from that of the substrate 10.

To be more specific, in the second embodiment, the insulative coating 36 is provided only over the surrounding of die patterns. Thus, not only the semiconductor-element mounting substrate 35 exerts almost the same effects as the semiconductor-element mounting substrate 10 of the first embodiment described above, but also the absence of the insulative coating 36 over the die pattern 12 allows a semiconductor device employing the substrate 35 to be thinner than the case where the semiconductor-element mounting substrate 10 of the first embodiment is employed. Moreover, electrical conduction between the die patterns 12 and the IC chips 21 and 22 placed above the die patterns 12 can be established easily. Furthermore, the surface area of the insulative coating 36 decreases, so that the amount of moisture absorption also becomes small. Therefore, during solder reflow and the like, exfoliation of the IC chips 21 and 22 can be prevented from being promoted by gasification of the absorbed ingredients. Accordingly, even though a precise humidity control and the like are not performed during fabrication of the semiconductor device, a highly reliable semiconductor device with high fabrication yields can be provided.

The insulative coating 36 is made of a photosensitive resin material, and applied using a photolithography process and an etching process. The die patterns 12, the first terminals 13, the through conductors 14, the second terminals 15, and the conductive interconnects 17 are formed with gold thin films, respectively.

Figure 5A:
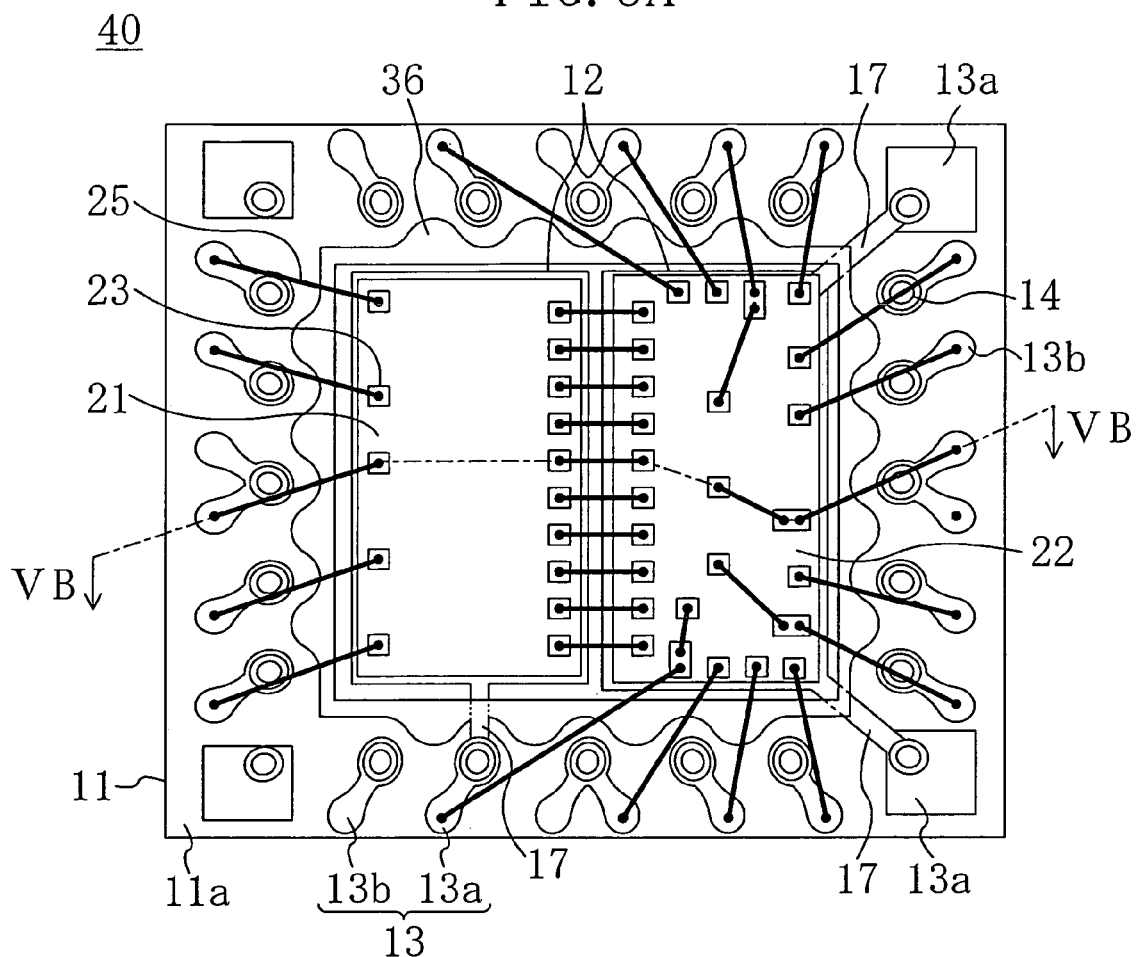
FIG. 5A is a plan view showing the structure of a semiconductor device according to the second embodiment of the present invention.
Figure 5B:
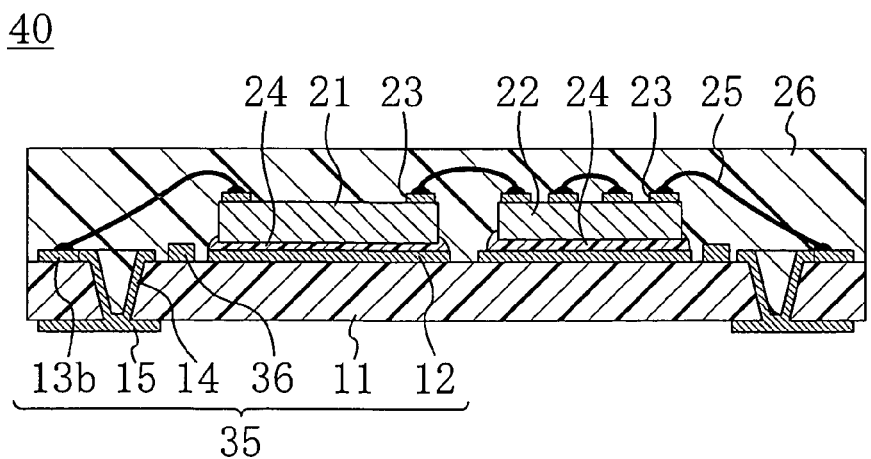
FIG. 5B is a sectional view of the device taken along the line VB-VB in FIG. 5A.

FIG. 5 illustrates the structure of a semiconductor device 40 fabricated using the semiconductor-element mounting substrate 35. FIG. 5A is a plan view of the semiconductor device 40, and FIG. 5B is a sectional view thereof taken along the line VB-VB in FIG. 5A.

As compared to the semiconductor device 20 of the first embodiment, the semiconductor device 40 of the second embodiment is characterized in that the structure of the semiconductor-element mounting substrate 35 differs from that of the device 20. Thus, the semiconductor device 40 exerts almost the same effects as the semiconductor-element mounting substrate 35. To be more specific, the insulative coating 36 is provided over the surrounding of die patterns. This provides a high adhesion between the insulative coating 36 and the sealing resin 26. In addition, the sealing resin 26 also fills the inside of the through conductors 14, 14, . . . . With this, even though portions of the IC chips 21 and 22 exfoliate from the associated die patterns 12, further exfoliation can be prevented from reaching the region where the through conductors 14, 14, . . . are located. This prevents device failure resulting from breaks or the like in the first terminals 13, 13, . . . and the wire leads 25, 25, . . . .

Furthermore, since with the conductive adhesive 24, the IC chips 21 and 22 are bonded directly to the die pattern 12, electrical conduction between the IC chips 21 and 22 and the associated die patterns 12 can be established easily. Moreover, since no insulative coating 36 is provided over the die pattern 12, the semiconductor device 40 can be thinned. In addition, a decrease in the fabrication area of the insulative coating 36 also reduces the amount of moisture absorption, so that during solder reflow and the like, it is easy to prevent promotion of the exfoliation due to gasification of the absorbed ingredients. Accordingly, even though a precise humidity control and the like are not performed during fabrication of the semiconductor device, a highly reliable semiconductor device 40 with high fabrication yields can be provided.

Third Embodiment

Figure 6A:
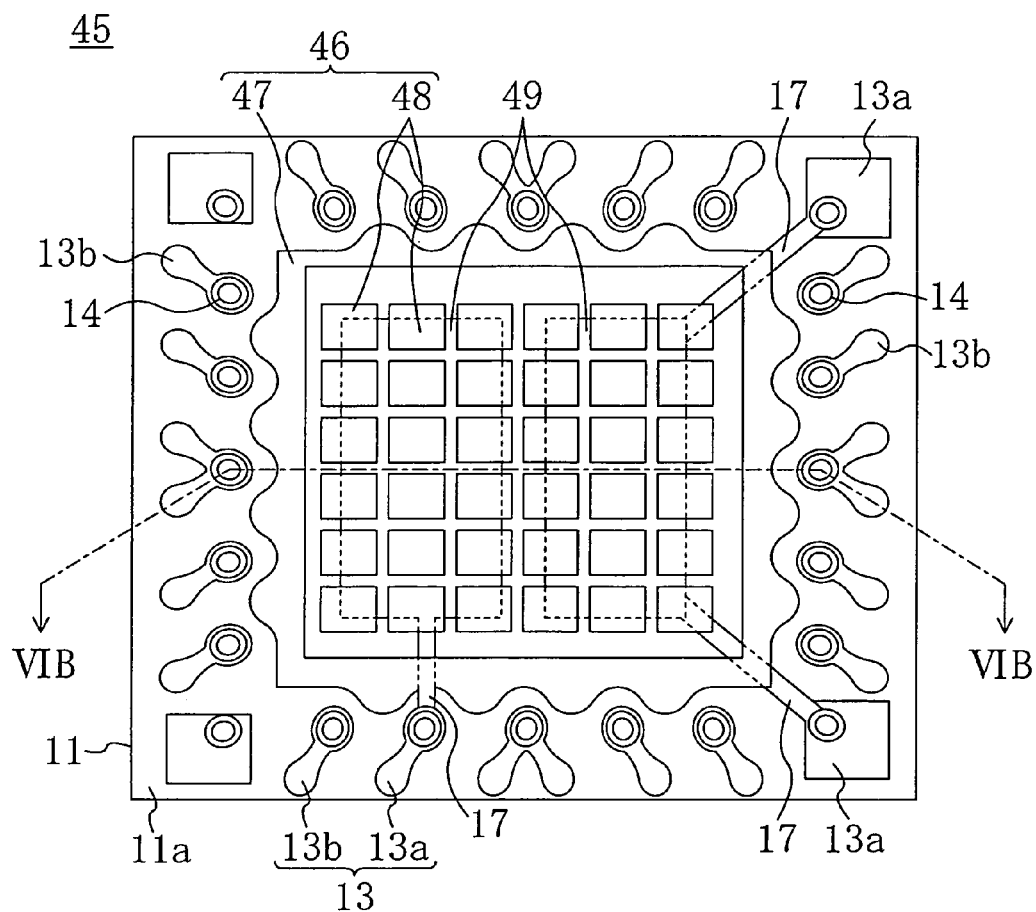
FIG. 6A is a plan view showing the structure of a semiconductor-element mounting substrate according to a third embodiment of the present invention.
Figure 6B:
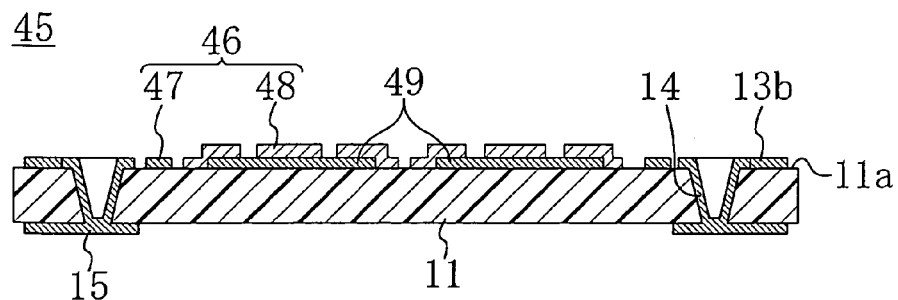
FIG. 6B is a sectional view of the substrate taken along the line VIB-VIB in FIG. 6A.

FIG. 6 shows the structure of a semiconductor-element mounting substrate 45 according to a third embodiment. FIG. 6A is a plan view of the semiconductor-element mounting substrate 45, and FIG. 6B is a sectional view thereof taken along the line VIB-VIB in FIG. 6A.

As compared to the semiconductor-element mounting substrate 10 of the first embodiment, the semiconductor-element mounting substrate 45 of the third embodiment is characterized in that the geometry of an insulative coating 46 differs from that of the substrate 10 and the outside dimensions of die patterns 49 are smaller than those of the IC chips 21 and 22.

To be more specific, in the third embodiment, the insulative coating 46 is composed of: a first insulative coating 47 provided over only the surrounding of the die patterns; and a plurality of second insulative coatings 48, 48, . . . provided over the die patterns 49. The second insulative coatings 48, 48, . . . are separately arranged in an array pattern. The first insulative coating 47 and the second insulative coatings 48, 48, ... are each made of a photosensitive resin material, and applied using a photolithography process and an etching process.

The outside dimensions of the die patterns 49 are smaller than those of the IC chips 21 and 22.

Portions of the die patterns 49 not provided with the second insulative coatings 48, 48, ..., the first terminals 13, 13, ..., the through conductors 14, 14, ..., the second terminals 15, 15, ..., and the conductive interconnects 17, 17, ... are formed with gold thin films, respectively.

The semiconductor-element mounting substrate 45 having such a structure exerts almost the same effects as the semiconductor-element mounting substrate 10 of the first embodiment described above. That is to say, even though the thickness of the substrate body 11 is decreased, warp of the substrate is difficult to cause. Also, even though the IC chips 21 and 22 are mounted thereto, exfoliation and the like are difficult to cause.

The die patterns 49 are provided with the second insulative coatings 48, 48, ... With this, the IC chips 21 and 22 can be bonded more firmly to the die patterns 49 than the case where a gold thin film is formed on the die patterns not provided with the second insulative coating and the IC chips are then placed thereon.

Moreover, since the second insulative coatings 48, 48, ... are arranged separately from each other, the insulative coating 46 in its entirety can reduce stress. Furthermore, since the outside dimensions of the die patterns 49 are smaller than those of the IC chips 21 and 22, stress generated from the die patterns 49 can also be reduced. As a result, even though the IC chips 21 and 22 are mounted and sealing is performed with the sealing resin 26, the occurrence of failure such as exfoliation of the IC chips 21 and 22 can be prevented reliably. Accordingly, even though the substrate is subjected to solder reflow or heat cycling, device failure resulting from breaks in the wire leads 25, 25, ..., the first terminals 13, 13, ..., the conductive interconnects 17, 17, ..., and the like can be prevented.

Figure 7A:
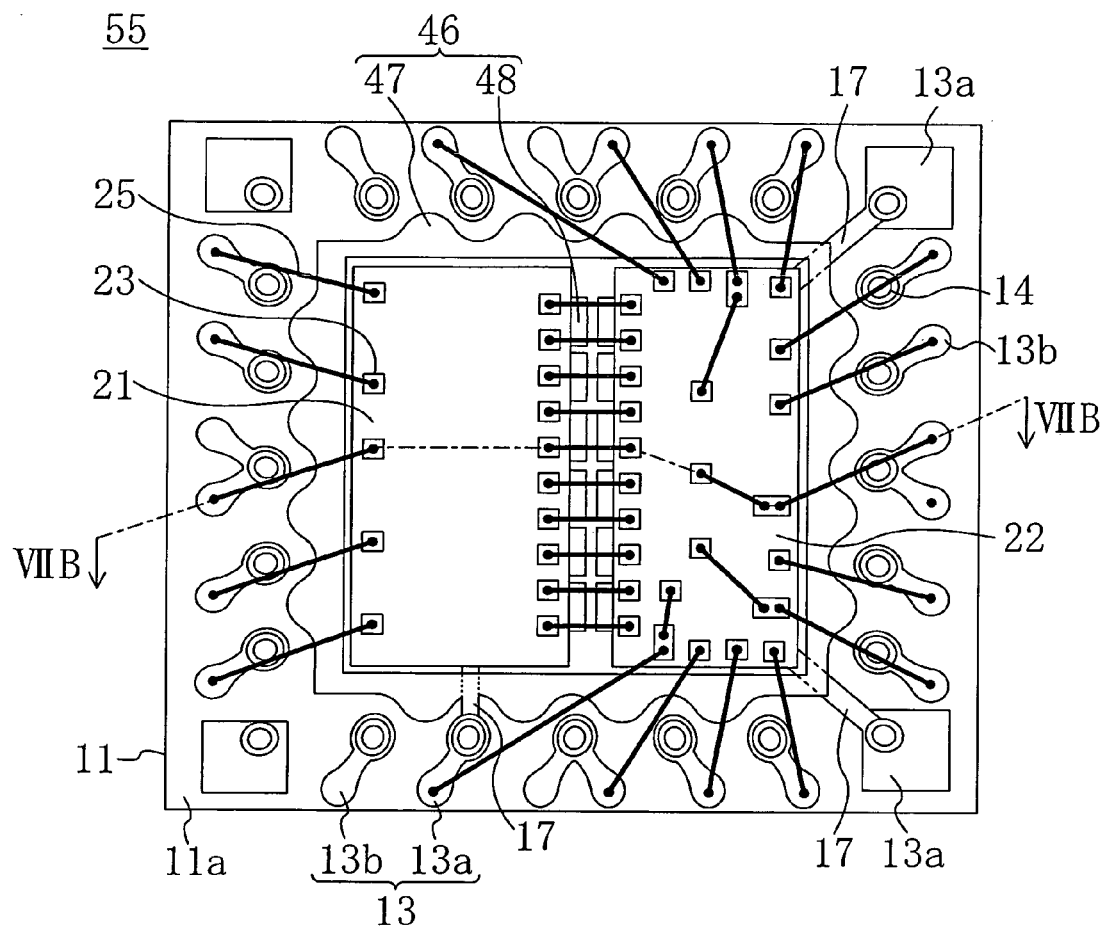
FIG. 7A is a plan view showing the structure of a semiconductor device according to the third embodiment of the present invention.
Figure 7B:
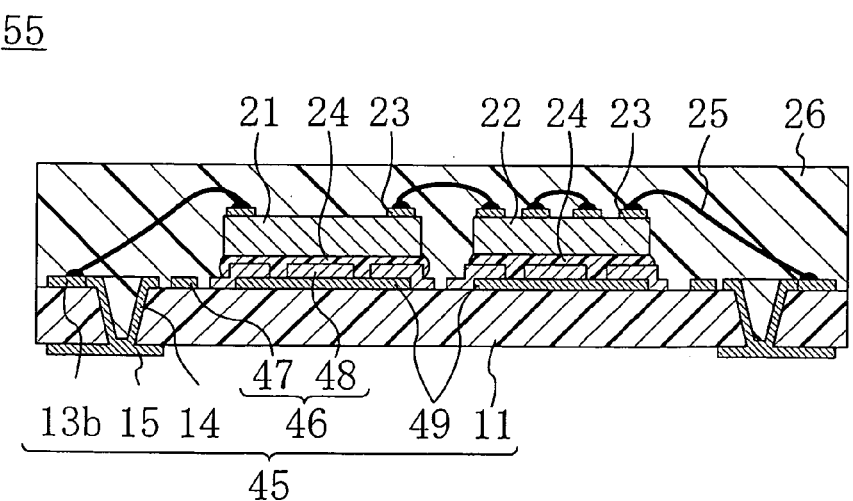
FIG. 7B is a sectional view of the device taken along the line VIIB-VIIB in FIG. 7A.
Figure 8A:
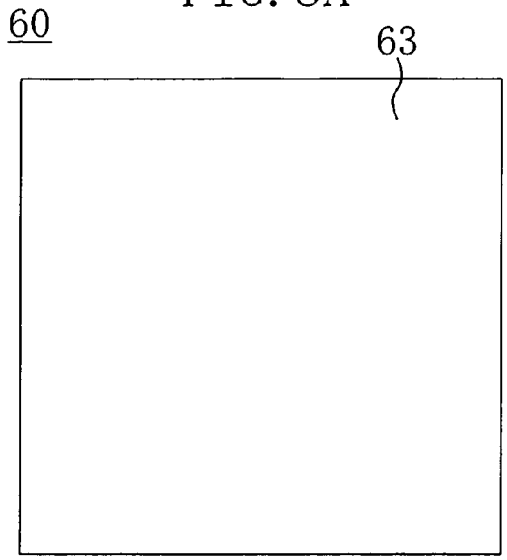
FIG. 8A is a top view of a power amplifier circuit module in which a semiconductor chip of silicon and a semiconductor chip of gallium arsenide are used as IC chips.
Figure 8B:
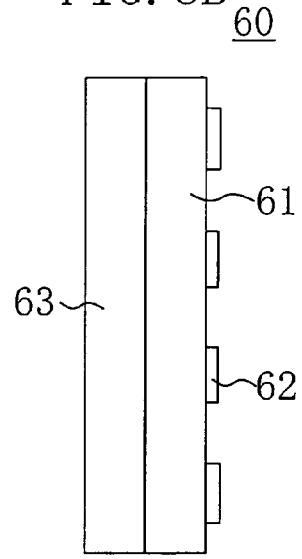
FIG. 8B is a right side view of the power amplifier circuit module shown in FIG. 8A.
Figure 8C:
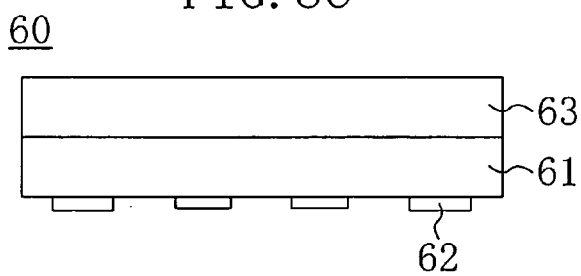
FIG. 8C is a front view of the power amplifier circuit module shown in FIG. 8A.
Figure 8D:
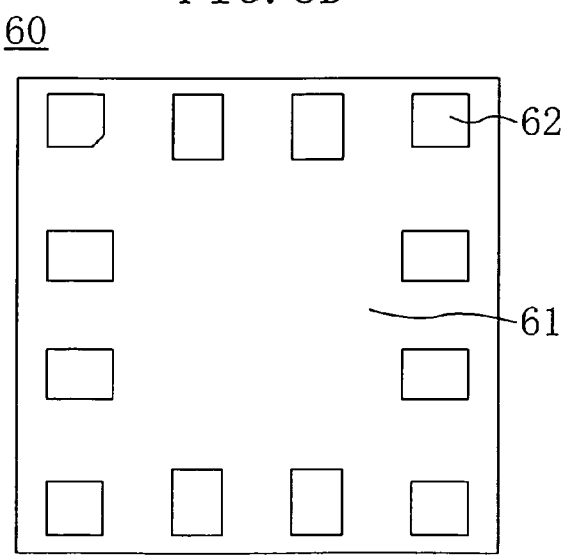
FIG. 8D is a bottom view of the power amplifier circuit module shown in FIG. 8A.

FIG. 7 illustrates the structure of a semiconductor device 55 fabricated using the semiconductor-element mounting substrate 45. FIG. 7A is a plan view of the semiconductor device 55, and FIG. 7B is a sectional view thereof taken along the line VIIB-VIIB in FIG. 7A.

As compared to the semiconductor device 20 of the first embodiment, the semiconductor device 55 of the third embodiment is characterized in that the structure of the semiconductor-element mounting substrate 45 differs from that of the device 20. Thus, the semiconductor device 55 exerts almost the same effects as the semiconductor-element mounting substrate 45.

Hereinafter, a fabrication method of the semiconductor device 55 according to the third embodiment will be described briefly.

First, the IC chips 21 and 22 are aligned with the associated die patterns 49 of the semiconductor-element mounting substrate 45 shown in FIG. 6. In this state, through the epoxy-based conductive adhesive 24 with, for example, silver filler added therein, the chips are bonded to the second insulative coatings 48, 48, ... and portions of the die patterns 49 not provided with the second insulative coatings 48, 48.

Then, with the wire leads 25, 25, ..., the electrode terminals 23, 23, ... of the IC chips 21 and 22 are connected by wire bonding to the first electrically-connecting terminals 13b, 13b, ..., respectively. Preferably, a gold wire is used as the wire lead 25. With this procedure, electric connection between the semiconductor-element mounting substrate 45 and the IC chips 21 and 22 is established. Then, an external voltage is applied to the second terminals 15, 15, ... to conduct electrical inspections on the semiconductor device 55.

Subsequently, using a sealing resin material such as thermosetting resin, for example, epoxy-based resin employing silica for filler, resin sealing is performed to embed the IC chips 21 and 22 and the wire leads 25, 25, .... In this sealing, the sealing resin 26 also fills the openings of the through conductors 14, whereby the adhesion between the semiconductor-element mounting substrate 45 and the sealing resin 26 can be made more firmly. In the manner described above, the semiconductor device 55 can be fabricated.

Since the semiconductor device 55 with such a structure according to the third embodiment includes the semiconductor-element mounting substrate 45 described above, it can offer almost the same effects exerted by the semiconductor-element mounting substrate 45.

To be more specific, since the IC chips 21 and 22 are bonded mainly to the second insulative coatings 48, 48, ..., bonding is made more firmly than the case where with an conductive adhesive, they are bonded to the die patterns formed with only a gold thin film.

Since the second insulative coatings 48, 48, ... are arranged separately from each other, the insulative coating 46 in its entirety can reduce stress. Furthermore, since the outside dimensions of the die patterns 49 are smaller than those of the IC chips 21 and 22, stress generated from the die patterns 49 can also be reduced. As a result, even though the IC chips 21 and 22 are mounted and sealing is performed with the sealing resin 26, the occurrence of failure such as exfoliation of the IC chips 21 and 22 can be prevented reliably. Accordingly, even though the substrate is subjected to solder reflow or heat cycling, device failure resulting from breaks in the wire leads 25, 25, ..., the first terminals 13, 13, ..., the conductive interconnects 17, 17, ..., and the like can be prevented.

FIG. 8 illustrates an outline structure of an exemplary power amplifier circuit module 60 as a semiconductor device, which is fabricated using a semiconductor chip of silicon and a semiconductor chip of gallium arsenide as IC chips. FIGS. 8A, 8B, 8C, and 8D are top, right-side, front, and bottom views of the power amplifier circuit module 60, respectively. The power amplifier circuit module 60 includes a semiconductor-element mounting substrate 61 which has almost the same inner structure as the semiconductor-element mounting substrate 45 described above. However, as shown in FIG. 8D, the semiconductor-element mounting substrate 61 uses a substrate body having a different number of second terminals 62, 62, ... and also different numbers of through conductors (not shown) and first terminals (not shown).

The substrate body is made of BT resin. A sealing resin 63 is made of epoxy resin. The first terminals (not shown), the die patterns (not shown), the second terminals 62, and the like are formed at their surfaces with electroless gold plating. The outside dimensions of the power amplifier circuit module 60 are 2 mm×2 mm×0.6 mm. The power amplifier circuit module 60 having such a structure was fabricated and then tested for heat resistance to solder reflow. The result of this test was that the number of defective portions was zero. Moreover, from a heat cycling test conducted on the module 60, it was confirmed that the module 60 has a good reliability. This power amplifier circuit module 60 can be employed for a power amplifier circuit of a cellular telephone.

OTHER EMBODIMENTS

In the first to third embodiments, description has been made of the structure in which neither interconnection pattern nor penetrating hole is formed in the lower portion of the die pattern of the semiconductor-element mounting substrate. However, a penetrating hole may be formed in the lower portion of the die pattern.

In addition, description has been made of the semiconductor-element mounting substrate having the double-sided wiring arrangement. However, the present invention is not limited to this, and alternatively the substrate may have a multilayer wiring arrangement.

An additional interconnection pattern may be formed over the mounting surface or the surface of the substrate formed with the second terminals.

Using the semiconductor-element mounting substrate according to the second and third embodiments, the electronic equipment shown in FIG. 9 may be fabricated.

What is claimed is:

1. A semiconductor device comprising:
a substrate; and
a semiconductor element mounted on the substrate;
wherein the substrate includes:
  a substrate body having a first surface on which the semiconductor element is mounted;
  a die pattern formed on the first surface and electrically connected to the semiconductor element;
  a plurality of recess portions formed in the substrate body;
  a plurality of through conductors, each formed in one of the plurality of recess portions and each extending from the first surface of the substrate body to a second surface opposite to the first surface relative to the die pattern;
  a plurality of first terminals, each having an opening which coincides with one of the recess portions and is electrically connected to one of the plurality of through conductors, and each having an extending portion which extends away from an edge of the corresponding one of the recess portions and away from the semiconductor element toward the outer edge of the mounting surface; and
  a plurality of bonding wires electrically connecting the extending portion of the first terminals with the semiconductor element.

2. The device of claim 1, wherein:
at least one of the plurality of first terminals is a first grounding terminal for grounding the die pattern, and
the substrate further comprises a conductive interconnect for electrically connecting the first grounding terminal to the die pattern.

3. The device of claim 1, wherein the plurality of first terminals are arranged radially from the die pattern.

4. The device of claim 2, wherein a gold film is provided on the conductive interconnect.

5. The device of claim 1, wherein the outside dimensions of the die pattern are smaller than those of the semiconductor element.

6. The device of claim 1, wherein at least an insulative coating is provided over a portion of the substrate body which surrounds the die pattern and which is located closer to the first surface than the through conductors.

7. The device of claim 6, further comprising a sealing resin for sealing the semiconductor element,
wherein the sealing resin is bonded to the insulative coating.

8. The device of claim 6, wherein a gold film is provided on a portion of the die pattern not provided with the insulative coating, the first terminals, and the through conductors.

9. The device of claim 1, wherein the substrate body is made of resin.

10. The device of claim 1, wherein the semiconductor element is provided in plural.

11. The device of claim 10, wherein the device is a power amplifier circuit module including a semiconductor element of silicon and a semiconductor element of gallium arsenide.

12. Electronic equipment comprising the semiconductor device of claim 1.

13. The device of claim 1, wherein the extending portions of the plurality of first terminals are directly connected to the semiconductor element by the plurality of wires.

14. The device of claim 1, wherein the plurality of wires include a plurality of bonding wires.

15. The device of claim 1, further comprising a plurality of second terminals formed on the second surface and electrically connected to the first terminals via the through conductors, respectively.

16. The device of claim 1, wherein:
a diameter of the recess portion at the first surface is bigger than a diameter of the recess portion at the second surface.

17. The device of claim 1, wherein:
the through conductors formed in one of the recess portions forms a cone shape such that the diameter of the through conductors at the first surface is larger than the diameter of the through conductors close to the second surface.

18. The device of claim 1, wherein:
when viewed from the first surface, a shape of the recess portion is a circle.

19. The device of claim 1, wherein:
each of the plurality of first terminals has a bowling pin shape.

* * * * *